US008816752B2

(12) United States Patent
Smith

(10) Patent No.: US 8,816,752 B2
(45) Date of Patent: Aug. 26, 2014

(54) ADAPTIVE TRIAC CONTROLLER

(71) Applicant: Silicon Laboratories Inc., Austin, TX (US)

(72) Inventor: Eric B. Smith, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/731,319

(22) Filed: Dec. 31, 2012

(65) Prior Publication Data
US 2013/0249604 A1    Sep. 26, 2013

Related U.S. Application Data

(60) Provisional application No. 61/614,801, filed on Mar. 23, 2012.

(51) Int. Cl.
*H03K 17/72*    (2006.01)

(52) U.S. Cl.
USPC ........... 327/446; 327/452; 327/469; 327/476; 363/84; 363/126

(58) Field of Classification Search
USPC ............ 327/446, 452, 469, 476; 323/84, 126; 363/84, 126
See application file for complete search history.

(56) References Cited

U.S. PATENT DOCUMENTS 3,381,226 A * 4/1968 Jones et al. .................... 307/651
5,654,884 A * 8/1997 Mohan .......................... 363/126

* cited by examiner

*Primary Examiner* — John Poos
(74) *Attorney, Agent, or Firm* — Abel Law Group, LLP

(57) ABSTRACT

A low voltage AC power controller uses a line coupled capacitor AC to DC converter circuit to obtain energy from AC line power supplied to an AC load and may be used with an external high voltage AC switching device to control power supplied to the AC load. The line coupled capacitor AC to DC converter circuit provides a low power device that senses characteristics of the power supplied to the load and can communicate sensed information and/or receive control information related to the power supplied to load.

20 Claims, 10 Drawing Sheets

US 8,816,752 B2

ADAPTIVE TRIAC CONTROLLER

CROSS REFERENCE TO RELATED APPLICATIONS

This application claims benefit of provisional application entitled "AC Power Controller", application No. 61/614,801, filed Mar. 23, 2012, which application is incorporated herein by reference in its entirety.

BACKGROUND

1. Field of the Invention

The invention relates to electrical devices and more particularly to sensing and control of power supplied to electrical loads.

2. Description of the Related Art

Growing development across the globe has driven consistent increases in electric power consumption. The installed base of electrical devices is likely on the order of 1 T. A typical house or business in an industrialized country has one or more meters, dozens or more circuits (breakers) and hundreds or more loads (devices). On the order of 100 billion new electrically powered devices are sold each year, from light bulbs to motors to appliances. The electrical devices consume the electrical energy from the electrical power grid supplied in the form of alternating current (AC) power.

SUMMARY OF EMBODIMENTS OF THE INVENTION

In an embodiment an apparatus includes an adaptive triac control circuit to supply a triac gate drive signal at successively lower levels of at least one of pulse width and current magnitude to determine an effective drive signal having a lower level of at least one of pulse width and current magnitude than an initial triac gate drive signal.

In another embodiment a method includes supplying a triac gate drive signal at a plurality of levels of at least one of pulse width and current magnitude to determine an effective gate drive signal that causes the triac to switch, the effective drive signal having a lower level of at least one of pulse width and current magnitude than at least another triac gate drive signal supplied at one of the plurality of levels.

In another embodiment, a method of calibrating a triode alternating current switch (triac) includes supplying a plurality of different levels of a gate drive signal to the triac. The triac selectively supplies power to a load according to the gate drive signal. The different levels of the gate drive signal are different with respect to at least one of pulse width and current magnitude. Triac switching is monitored to determine which of the different levels of the gate drive signal causes the triac to switch and thereby supply the power to the load.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
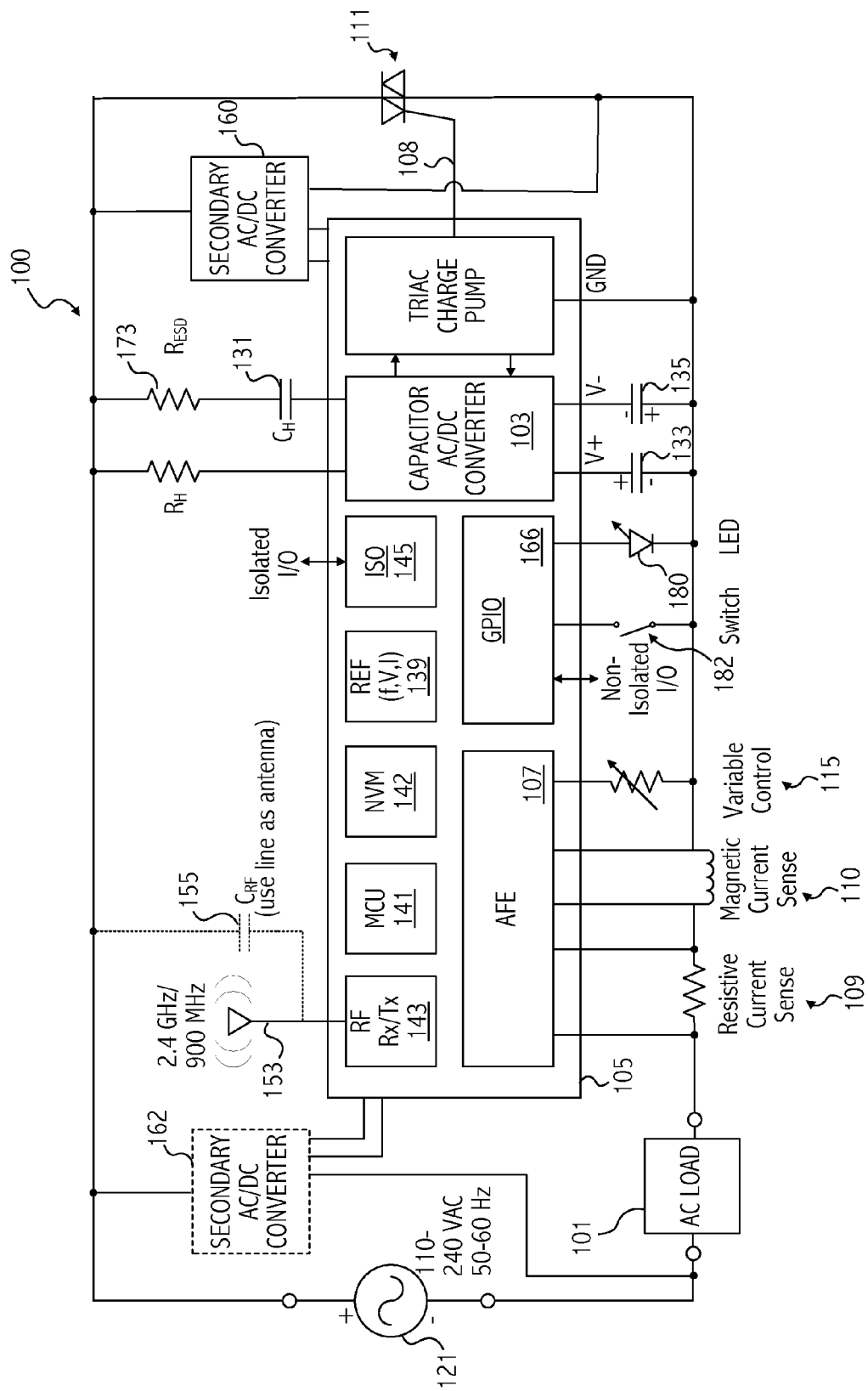
FIG. 1 is a block diagram illustrating an embodiment of a power controller including features described herein.

Referring to FIG. 1, illustrated is an exemplary embodiment of a power control device 100 that actuates (controls) and/or measures (senses) the flow of electric current and voltage through an AC load 101. Because there are so many electrical devices in a home or business, it is important that control and sensing does not significantly add to the electrical load as that would discourage the use of such monitoring and control devices. Accordingly, one aspect of the power control AC power controller 100 is that it manages off-state power to try to simplify and/or reduce the power requirements for the controller. FIG. 1 illustrates major functional blocks that may be associated with one or more embodiments of the power controller 100 including a line coupled capacitive AC/DC converter circuit 103 to provide power for other functional blocks of the AC power controller 100, which is described further herein. The AC power controller 100 includes a mixed signal integrated circuit 105 that has an analog front end (AFE) 107 that provides, in an embodiment, among other functionality, measurement capability related to the power being supplied to the load 101 by power source 121. For example, the current supplied to the load may be sensed using well known current measurement techniques such as resistive current sense 109 or magnetic current sense 110. In addition, the AFE 107 may include a variable control input 115 and control power being supplied to the load 101 based on that input. For example, the variable control input may be a dimmer for a light. In addition a resistor 173 may be utilized in some embodiments to provide electrostatic discharge (ESD) protection.

A wide variety of electrical loads may be monitored and/or controlled. For example, the load may be a wall switch/dimmer, an outlet, an electrical appliance such as a refrigerator, stove, washing machine or drier, a power strip, AC/DC adapters, light bulbs, light fixtures, AC circuit breakers (provides circuit level visibility to full house load), an electric meter, wireless connection to thermostats, security, sensors, heating ventilation and air conditioning (HVAC). The examples should not be construed to be limiting and any device that utilizes or supplies electrical current may benefit from use of embodiments described herein.

Figure 2:
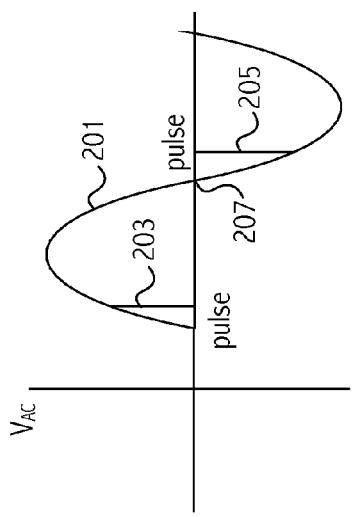
FIG. 2 illustrates operation of an actuator of FIG. 1 implemented using a triac.

In order to control the power supplied to the load 101, the AC power controller 100 includes an actuator 111 that controls the power supplied to the load. In an embodiment, the actuator functions as a switch that can be turned on and turned off. The actuator 111 in one embodiment is a bidirectional triode thyristor, also referred to as a triac (triode alternating current switch), which can be controlled from the low voltage device 105. The triac is a bidirectional switching device that has two thyristors with a common gate. The triac may operate as shown in FIG. 2 showing leading edge control. Assume an AC wave form 201 shown in FIG. 2. The AC waveform may range from, e.g., 110-240 VAC at 50-60 Hz. The triac turns on to allow current through the triac when a pulse at 203 is supplied to the gate of the triac through node 108. The pulse may be 100 mA at 1.5 V for 100 microseconds. Of course, the pulse width, voltage, and current values utilized can vary according to the particular triac utilized and/or other system requirements. Thus, the high current device (e.g., normal house currents) can be controlled with a low voltage pulse. Once the pulse turns the triac on, the triac stays on until the zero crossing at 207, at which point the triac turns off. A −100 mA magnitude pulse at −1.5 V for 100 microseconds at 205 turns the triac back on for the negative portion of the AC cycle. One way to control the power supplied to the load is by moving the location of the pulse to vary the duty cycle from 0 to 100% (thereby changing the portion of the waveform that is actually supplied to the load). Actuators such as the triac are typically used when driving resistive loads such as incandescent bulbs, many LED controllers and some inductive loads.

Figure 3A:
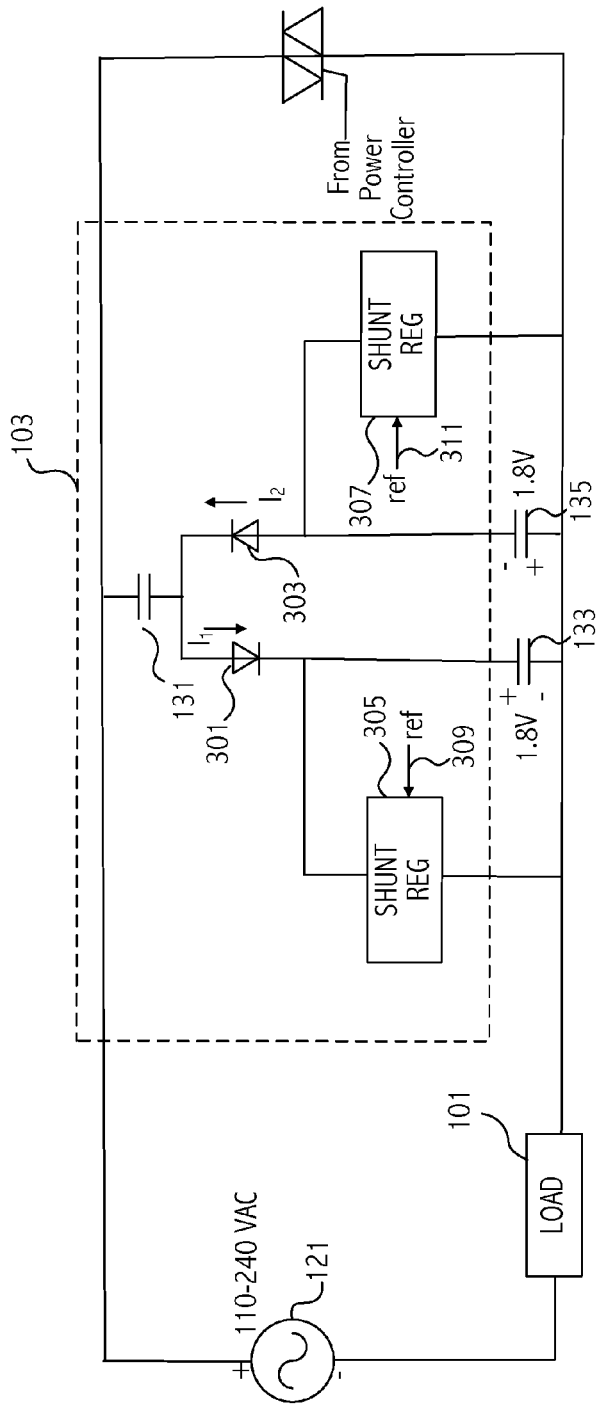
FIG. 3A illustrates an embodiment of a line coupled capacitor AC to DC converter circuit that may be used in the embodiment of FIG. 1.

In an embodiment where the AC power controller uses low power, particularly in the off-state, as described further herein, a line coupled capacitor alternating current (AC) to direct current (DC) converter circuit is used. An exemplary embodiment of the line coupled capacitor AC to DC converter circuit includes an on-chip portion 103 (on the integrated circuit 105), and off-chip capacitors. Additional details of the line coupled capacitor AC to DC converter circuit 103 are shown in FIG. 3A. The line coupled capacitor AC to DC converter circuit includes diodes 301 and 303 and shunt regulators 305 and 307. The capacitors in FIG. 3A are also shown in FIG. 1. As can be seen in FIG. 1, the capacitors 131, 133 and 135 are off-chip, that is, they are separate components from integrated circuit 105. Assume the AC power supply is 120 VAC at 60 Hz. The capacitor 131 charges and discharges once every cycle or 60 times a second. Current $I_1$ charges capacitor 133 during the positive portion of the cycle and current $I_2$ charges capacitor 135 during the negative portion of the cycle. The diode 301 allows current to charge capacitor 133 during the positive portion of the cycle (and prevents discharge back into the AC line during the negative portion of the cycle) and the diode 303 allows current to charge capacitor 135 during the negative portion of the cycle (and prevents discharge back into the AC line during the positive portion of the cycle). The capacitor 131 does not consume power, but transfers energy to a different phase. The capacitors 133 and 135 store energy for use by the functional blocks in integrated circuit 105. The total current obtained is $I_1+I_2$. The shunt regulators 305 and 307 ensure that the capacitors 133 and 135 charge to a predetermined voltage based on the reference voltages 309 and 311, e.g., 1.8 volts after which any further charge is diverted by the shunt regulators. Note that 1.8 volts is an exemplary voltage level and other voltage levels may be utilized according to the requirements of particular embodiments. In an exemplary embodiment the capacitor 131 is a 100 nF capacitor rated at 400 VAC. Capacitors 133 and 135 may be, e.g., 100 μF rated at 3 V. In order to work with 240 VAC power, a peak voltage of approximately 373 volts may be expected.

Figure 3B:
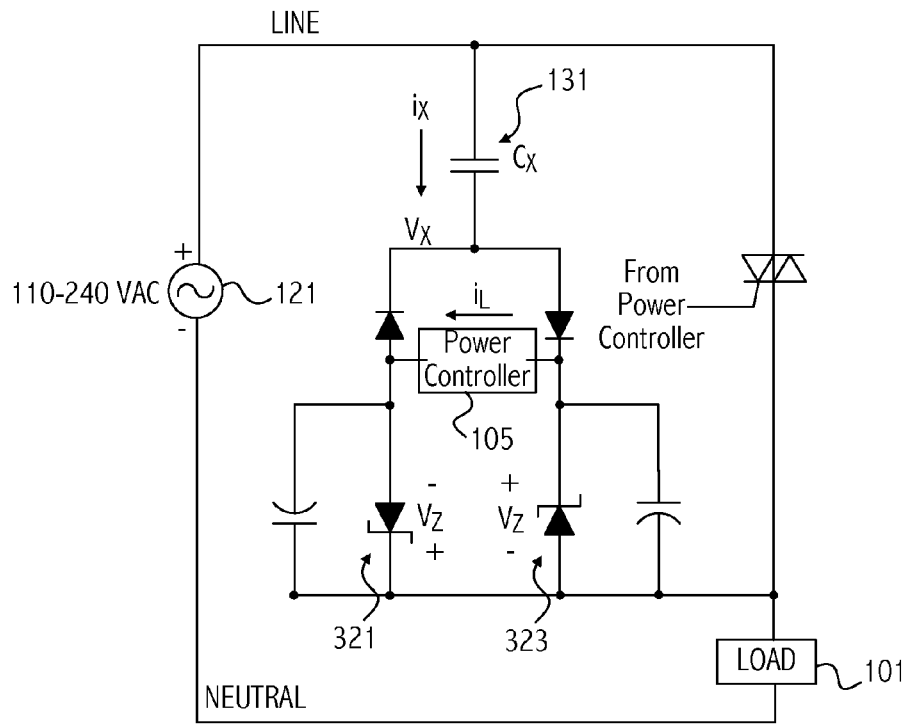
FIG. 3B illustrates an embodiment of a line coupled capacitor AC to DC converter circuit that may be used in the embodiment of FIG. 1.

FIG. 3B provides another illustration of a capacitor AC to DC converter that is similar to FIG. 3A with the zener diodes 321 and 323 functioning as the shunt regulators. The average power that can be obtained from the AC supply line may be determined by looking at the average current. Average current is a function of CxVxF, where C is capacitance (e.g., 0.1 μF), V is voltage (e.g., 120 volts), and F is frequency (e.g. 50 or 60 Hz). In the embodiment illustrated in FIG. 3B, with efficiency η the power ($P_{IC}$) available to the power controller 105 can be determined as:

$$i_{x\_rms} = 2\pi f_{line} C_x (V_{line\_rms} - V_x)$$

$$i_{x\_rms} \approx 2\pi f_{line} C_x V_{line\_rms}$$

$$i_{L\_max} = \frac{2\sqrt{2}}{\pi} i_{x\_rms}$$

$$P_{IC\_max} = V_z i_{L\_max}$$

$$P_{IC} = P_{load\_max} \times \eta$$

Note that the size of capacitor 131 can be increased to obtain more power, but the tradeoff is increased cost. A smaller capacitor may be used if less energy is needed in a particular embodiment.

The DC voltage obtained can be used to power various functional blocks in the AC power controller 100 that constitute the load 105. For example, the DC power may be used to power control logic such as the microcontroller (MCU) 141, communication logic associated with the RF transceiver 143 or isolation logic 145 to communicate using a suitable communication protocol with a device that is isolated from the line voltage. The reference block 139 provides appropriate voltage (V), current (I), frequency (F), and/or temperature (T) references for use by the other blocks. Thus, the REF block 139 may include a temperature sensor to provide sensed temperature, an LC, RC, MEMS, or other one or more oscillators may be used to provide a desired frequency and appropriate circuits to provide desired voltage and current levels for the functional blocks. Note that interconnections between the various blocks in FIG. 1 are not shown for ease of illustration.

Figure 4:
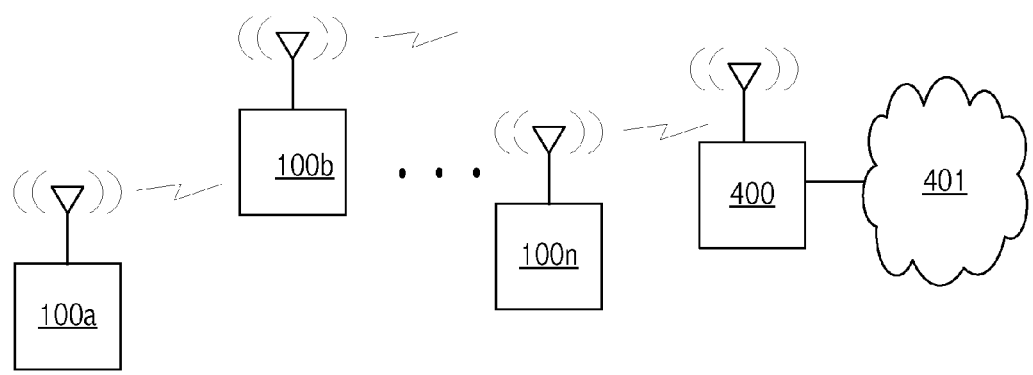
FIG. 4 illustrates a network topology into which a plurality of power controllers may be configured.

The RF receiver/transmitter block 143 provides a wireless communications interface. The use of a wireless interface may provide an embodiment which eliminates the need for isolation and thus the need for isolation logic 145. The RF protocol used by the device may be any appropriate short-range wireless protocol for transfer of data at relatively low rates (e.g., <1 mega bits per second (mbps), although other data rates are also possible). Note that the device may be transmitting and/or receiving intermittently. However, in other embodiments, where for example, the device is a repeater node in a mesh network, the device may be on as much as 100% of the time. An appropriate RF protocol for RF communications may be a standards-based protocol based on, e.g., IEEE 802.15.4, such as Zigbee or IPv6 over Low Power Wireless Personal Area Networks (6LoPAN), or other protocol. The transceiver may transmit and receive, e.g., at frequencies of 900 MHz, 2.4 or 5 GHz or other available frequencies. There may be multiple power controller devices in a particular location such as a house. As shown in FIG. 4, multiple power controllers 100a, 100b, . . . , 100n may be coupled and implemented as part of a mesh network, a point-to-point network, a star network, or in another suitable network topology. For example, power controller 100a may communicate with controller 400 through any or all of nodes 100b . . . 100n. Controller 400 may be a household controller that provides control functionality for alarm systems, HVAC systems, lighting, communication and entertainment systems, and other electrical devices. Controller 400 may have wired and/or wireless access through network 401 to provide remote Internet access to the power controllers. For wireless applications, a simple button on power controller 100 may be used for association to the network.

Referring again to FIG. 1, one aspect of the RF transceiver in power controller 100 is the need for an antenna for RF communication. In an embodiment, an antenna 153 may be implemented as a trace on a printed circuit board. In addition, or in place of the antenna 153, the transceiver 143 can couple to the AC lines through capacitor 155 and use the AC lines as an antenna.

In addition to, or in place of the wireless communication block 143, the AC power controller 100 may include isolation logic 145 to communicate with a device while ensuring the device is isolated from the line voltage. The isolation logic may provide capacitive isolation or some other appropriate isolation technique to isolate the AC power controller 100 from the destination with which it is communicating. The communications may utilize, e.g., a serial communication protocol in which commands may be received and status reported. Communications protocols such as I$^2$C, Serial Peripheral Interface (SPI), or a general purpose input/output (GPIO) terminal, or other appropriate communication interface may be used with isolation logic 145. Alternatively, or in addition, such communication protocols may be utilized without isolation to communicate with an external controller through general purpose input/output (GPIO) block 166. The GPIO block may provide a switch input 182 that controls the load (e.g., turns it on and off). The communication interfaces may be used to receive commands, configuration data, or other control inputs and to report information such as status based on sensed information as described further below.

The AC power controller 100 may utilize a low data rate over the RF and/or isolation interfaces to provide control functions such as turning on the load, turning off the load, dimming or brightening the load (where the load provides light). Further, the information related to power supplied to the load based on sensing information can also be provided using a low data rate. Exemplary information related to the power supplied to the load may include temperature sense, line voltage sense (resistor or capacitor), or line current sense (resistor or magnetic). The AC power controller 100 may detect a load change such as a bulb burnout and provide an indication over the appropriate communications interface (e.g., wireless, isolated, or non-isolated). The AC power controller 100 may provide line sampling for a programmable number of N cycles (N being an integer) of current and/or voltage, store the results, and transmit the results once the N cycles are complete. The sampling may be run periodically or on a one-time basis according to programmable settings. A fast Fourier transform (FFT) may be taken of these samples to indicate the harmonic content of e.g., the load current. The AC power controller may provide power factor measurement and calculation, energy consumption measurements (per hour, per day, or other specified time period), zero cross detection and line frequency synchronization, overload detection and shutdown (temp, current), and/or load sensing—type (incandescent, fluorescent, motor). Thus, a wide variety of information related to the power supplied to the load may be determined by the AC power controller.

The microcontroller unit (MCU) 141 may be programmed to perform the appropriate calculations to generate the aforementioned characteristics of the power supplied to the load based on the sensed information based on inputs from sensors in the analog front end 107 or other inputs. The microcontroller may utilize the non-volatile memory (NVM) 142 to store necessary program instructions for the microcontroller to effectuate the sensing and calculations for the information described above. Note that as the techniques to provide the various sensed information described herein are well understood by those of skill in the art, they will not be further described herein. The NVM 142 or other storage may be used to store the sensed information for later transmission. The sensing and reporting options described above are exemplary and any particular embodiment may sense and report any combination of these or other information related to the power supplied to the load that may be sensed and/or calculated based on sensed information. Alternatively, some embodiments may be configured to act solely as an actuator or solely as an AC power sensing and reporting device.

In order to function satisfactorily as a general actuator, the power controller 100 should be sufficiently responsive when a command (or other appropriate control input) is received. For example, the load may be a light coupled to be powered through the actuator 111. The RF transceiver 143 may be used to receive wireless commands to dim the light. Alternatively, variable control input 115 may provide the control indication to alter the power supplied to the load. There may be a tradeoff between fast response time and low power consumption. In order to maintain low power consumption for the AC power controller, a low duty cycle (ratio of on time to the measurement period) may be utilized of e.g., $\frac{1}{10}$, $\frac{1}{100}$ or $\frac{1}{1000}$. For a $\frac{1}{1000}$ duty cycle, the device is on for a millisecond every second. In order to satisfy human perceptions and thus be sufficiently responsive, a satisfactory response time should be provided. Thus, e.g., the device may wake up 10 times a second to see if a dimmer control has been changed as a result of a change through a human interface control (e.g., a dimmer switch) and be on for 1 ms. The dimmer information may come, e.g., through the variable control 115 or a command through the RF interface 143, or isolation interface 145. For an RF application, the duty cycle may be significantly higher depending on the protocol.

Figure 5:
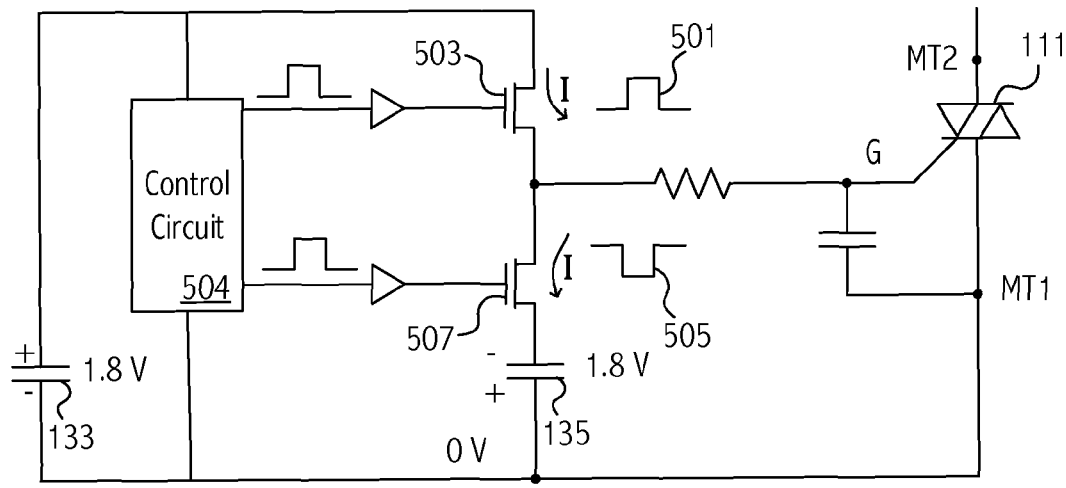
FIG. 5 illustrates exemplary control of the triac according to an embodiment.

FIG. 5 illustrates additional details for controlling the actuator when the actuator is implemented using a triac. A positive going pulse 501 may be supplied by turning on transistor 503 for e.g., 100 µs to provide a 100 mA, 1.5 V pulse to triac 111 to latch the triac (in a conducting state) for the positive going pulse. A negative going 100 mA, −1.5 V pulse 505 may be supplied to triac 111 by turning on transistor 507 for 100 µs. The capacitors 133 and 135 of FIG. 1 store harvested energy that are used to supply power for the triac control. The control circuit 504 to supply the appropriate control signals for the transistors 503 and 505 may utilize, at least in part, microcontroller 141 and/or other logic powered by the power obtained by the AC to DC converter.

Figure 6:
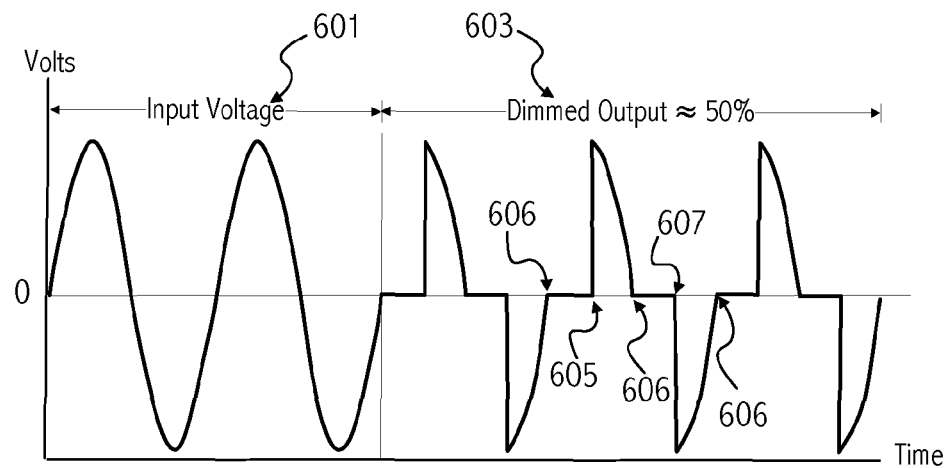
FIG. 6 illustrates leading edge control waveforms associated with a triac.

Referring to FIG. 6, the input voltage to the triac is shown at 601. The output voltage, assumed to be dimmed at approximately 50% is shown at 603. In operation in leading edge control, the triac turns off at the zero crossings 606. The control circuit 504 operates to turn on the triac for the positive portion of the cycle at 605. The control circuit 504 operates to turn on the triac for the negative portion of the cycle at 607 to achieve the waveform shown at 603.

Figure 7A:
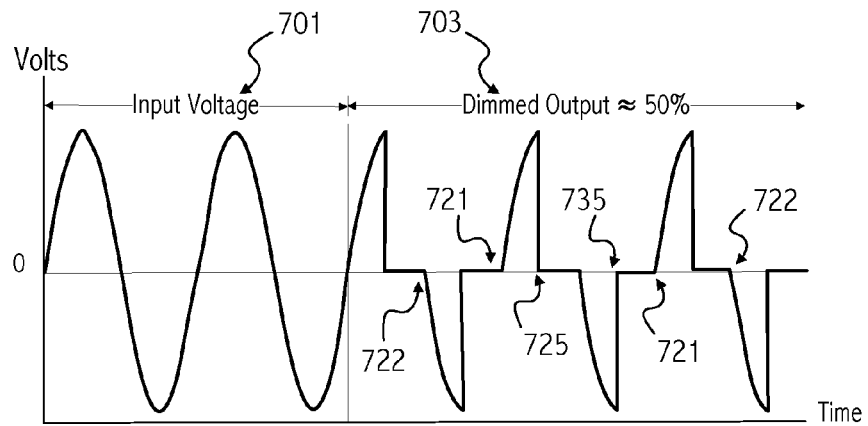
FIG. 7A illustrates a trailing edge control that may be used for controlling power supplied to a load.
Figure 7B:
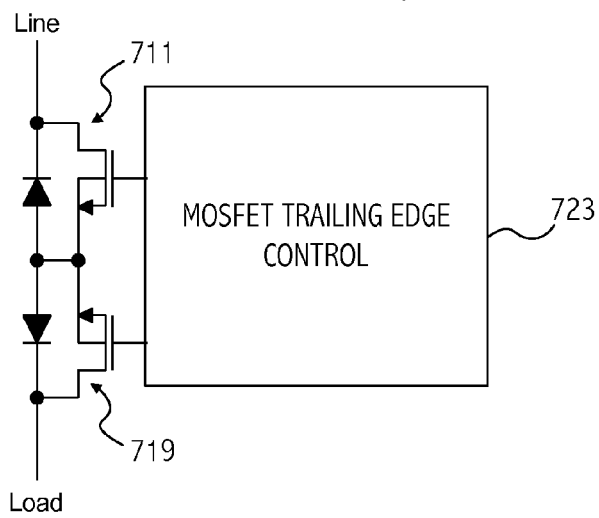
FIG. 7B illustrates an exemplary MOSFET circuit that may be utilized to provide the control illustrated in the waveforms of 7A.

While FIG. 6 illustrates leading edge control, trailing edge control is also widely used as shown in FIG. 7A and is typically implemented with two-series connected MOSFETS as shown in FIG. 7B, or a single MOSFET with steering diodes. The drive conditions are quite different for these trailing edge controlled actuators, which are used to drive capacitive loads such as CFL ballasts, electronic transformers, and some LED controllers. For the trailing edge control, the actuator turns on at the zero crossing as shown at 721. The trailing edge controller 723 may be implemented, using at least in part, microcontroller 141 and/or other logic powered by the DC power obtained from the line. Control logic causes MOSFET 711 to turn on at rising zero crossings 721 and MOSFET 719 to turn on at falling zero crossings 722. As shown in FIG. 7A at 703, when the load is dimmed, the control logic causes the MOSFET 711 to turn off at 725 and the MOSFET 719 to turn off at 735. In that way, power may be supplied to the load for only a portion of each cycle.

Figure 8:
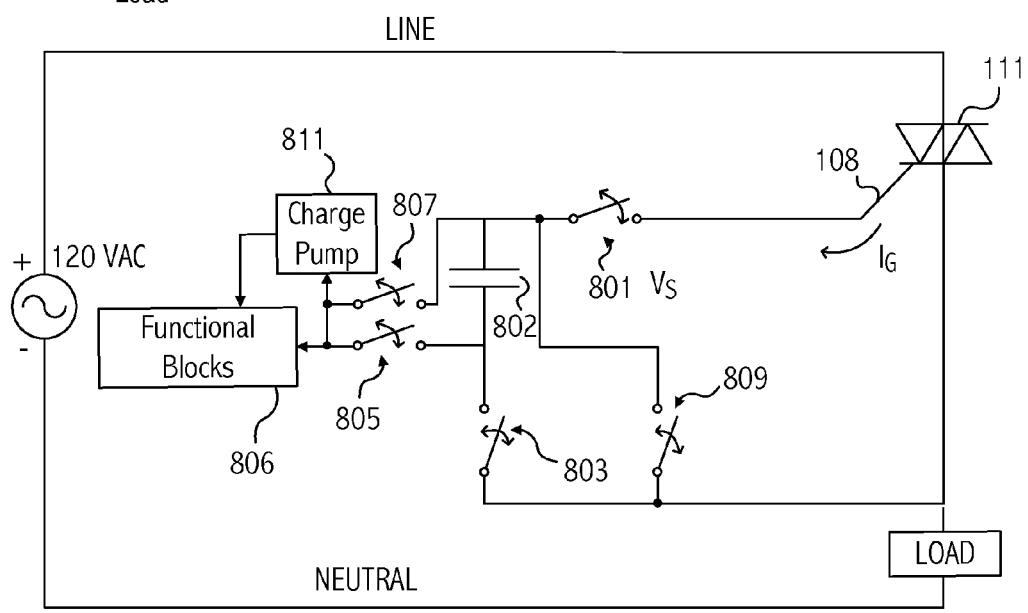
FIG. 8 illustrates an embodiment in which power is supplied through a low impedance gate node of the AC switching device for use by the AC power controller.

While the line coupled capacitor AC to DC converter can be used to power the device while the actuator is off, when the actuator is on, additional power may be available through the triac gate. For example, referring to FIG. 8, while the triac 111 is latched (in the on state), the gate node 108 provides a low impedance path for power and/or charge for use by components in the power controller 100. For example, while the triac 111 is latched, switches 801 and 803 may be closed to charge capacitor 802. Switches 807 may be closed (with switch 801 opened and 803 closed) to discharge capacitor 802 to provide the stored charge to the functional blocks 806 or charge pump 811. When the polarity of the triac voltage is reversed, switches 801 and 803 are closed to charge the capacitor 802 and switches 809 and 805 are closed (with the other switches open) to discharge the capacitor to provide the stored charge to the functional blocks 806 or charge pump 811. The power available to the functional blocks through the triac gate node may be higher than the power available from the line coupled capacitor AC to DC converter circuit using capacitor 131. The switches 801, 803, 805, 807 and 809 may be located on integrated circuit 105, while the capacitor 802 may be located off-chip. The gate current $i_{g\_max}$ is determined by $v_g$ modulation. $V_g$ has a diode temperature (T) coefficient (low at high T). The average gate current $i_{g\_avg}$ is determined by the minimum conduction angle. Thus, for embodiments where dimming is utilized, the available power may be less than if no dimming were used. Power may be obtained using triac gate current in place of, or in conjunction with, the power available through the line coupled AC to DC converter circuit.

Note that certain circuits of AC power controller 100 may require a different voltage level than other circuits. Therefore, the voltage may be increased, e.g., through the use of a charge pump circuit 811, to an appropriate voltage level for use by certain of the circuits. For example, an LED 180 (see FIG. 1) may be utilized on the AC power controller 100 to indicate the load is powered or the AC power controller 100 is active and have a higher voltage requirement than other circuits. That LED may be pulsed to save power and may only be activated when additional power is available through the triac. Certain circuits present in the analog front end 107 for sensing may only need to be powered when the triac is on and thus may receive their power through the triac gate node. For example, if the triac is off, there may be no need to sense current.

While one actuator may include a triac as described above, in other embodiments, a relay, MOSFETS, or other switch capable of switching on and off power supplied to loads may be utilized. FIG. 1 shows a number of functional blocks that may be combined in various embodiments. For example, the AC power controller 100 may operate simply as an AC power controller. In another embodiment, the AC power controller 100 may be an AC power controller with an isolated control port. Such a device may be implemented as a multi-chip module with an isolator die present in the module. In another embodiment, the AC power controller 100 may be an AC power controller with wireless transceiver (single chip or multi-chip module with a transceiver). The AC power controller may be configured to sense and report various aspects of the power supplied to the load. Various other combinations of functionality and features described above may be present in any particular embodiment.

Figure 9:
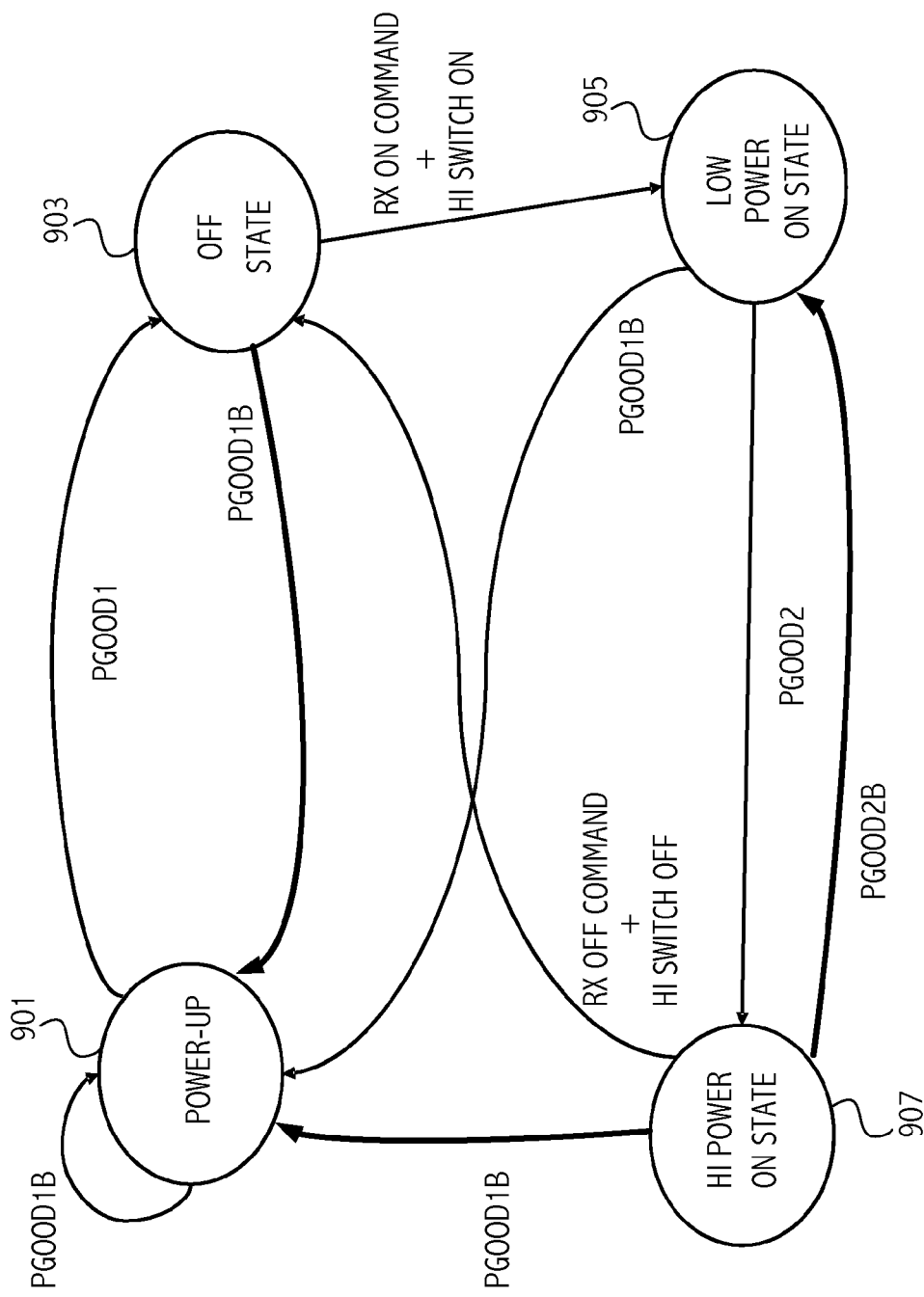
FIG. 9 illustrates a state diagram for an embodiment of a power controller.

Referring to FIG. 9, in an embodiment the power controller 100 (see FIG. 1) operates in both a low power mode and a high power mode. FIG. 9 illustrates an exemplary power controller state diagram. In 901, the power controller powers up in state 901. Assuming power is good (PGOOD1) the controller enters the off state 903. In the off state 903 the power controller creates a low-power DC supply voltage directly from the AC line using the line coupled capacitor AC to DC converter circuit as described e.g., with relation to FIGS. 3A and 3B. The power controller listens on the short range wireless connection (or other communication interface) for a command to turn on. The microcontroller (MCU 141) may be kept in a suspend state keeping its settings from a previous on-state. Miscellaneous analog functions such as providing timing, and appropriate voltage references also need to be performed. Those functions can be accomplished using the DC supply voltage generated directly from the AC line using the line coupled capacitor AC to DC converter circuit. A very low duty cycle to check for a turn-on command can help reduce power requirements in this state.

When a command is received on the communications interface to turn-on or a command is received over a human interface (HI) such as a switch, the power controller enters a low-power on state 905. In the low-power on state 905, the power controller creates the low-power DC supply voltage directly from the AC line using the line coupled capacitor AC to DC converter circuit. In addition, a secondary AC/DC power converter is powered-up as described further herein. The time to power up the secondary AD/DC power converter determines how long the power controller stays in the low-power on state. The MCU 141 is turned on and the actuator is turned on for a predetermined number of cycles at the appropriate power level corresponding to what was received in the turn-on command. Thus, in the low-power on state 905, the actuator (e.g., triac or MOSFETS) are turned on and the load receives power. In addition, an acknowledgement may be sent of the load turn-on and the communications interface has to listen for a next command (turn-off, dim, etc.). Note that certain functions such as the acknowledgment or listening for the next command may be delayed until the full power mode.

Once power from the secondary AC/DC power converter circuit is confirmed good (PGOOD2), the controller enters the high-power on state 907. In the high-power on state a higher power DC supply, e.g., >100 mW, is created directly from the AC line utilizing the secondary AC/DC power converter circuit. The triac is actuated at the required conduction angle consistent with the received command. The communication circuit listens for a command to turn-off or otherwise change the load state (e.g., a dim or brighten command). The MCU is in an active state and measurements are taken off line voltage and current as desired. The measured values may be stored for later transmission. If a command is received to turn off through the communications interface (e.g., short range wireless) or human interface, the state machine returns to the off-state 903. In the high-power on state, if the power good signal (PGOOD1B) indicates a problem with power, the state machine returns to the power-up state 901. In the high-power on state 907, if the power good signal indicates a problem with secondary power (PGOOD2B), the state machine returns to the low-power on state 905. In the low-power on state 905 or the off state 903, if the power good signal (PGOOD1B) indicates a problem with low voltage power, the state machine returns to the power-up state 901.

Referring to FIG. 1, the secondary AC to DC converter circuit 160 is shown. The secondary power supply provides more power than the line coupled capacitor AC to DC converter. In an exemplary embodiment the secondary power supply 160 supplies approximately 100-300 mW of power. The amount of power depends on the needs of the power controller 100 in the high-power on state. The control for the AC to DC converter may be provided by the control functionality on integrated circuit 105. The secondary power supply may be implemented as, e.g., a buck converter. Other AC to DC topologies may also be utilized. In addition, the AC to DC converter circuit may be configured as shown as AC to DC converter circuit 162 (instead of 160) with a connection to NEUTRAL as shown.

Figure 10:
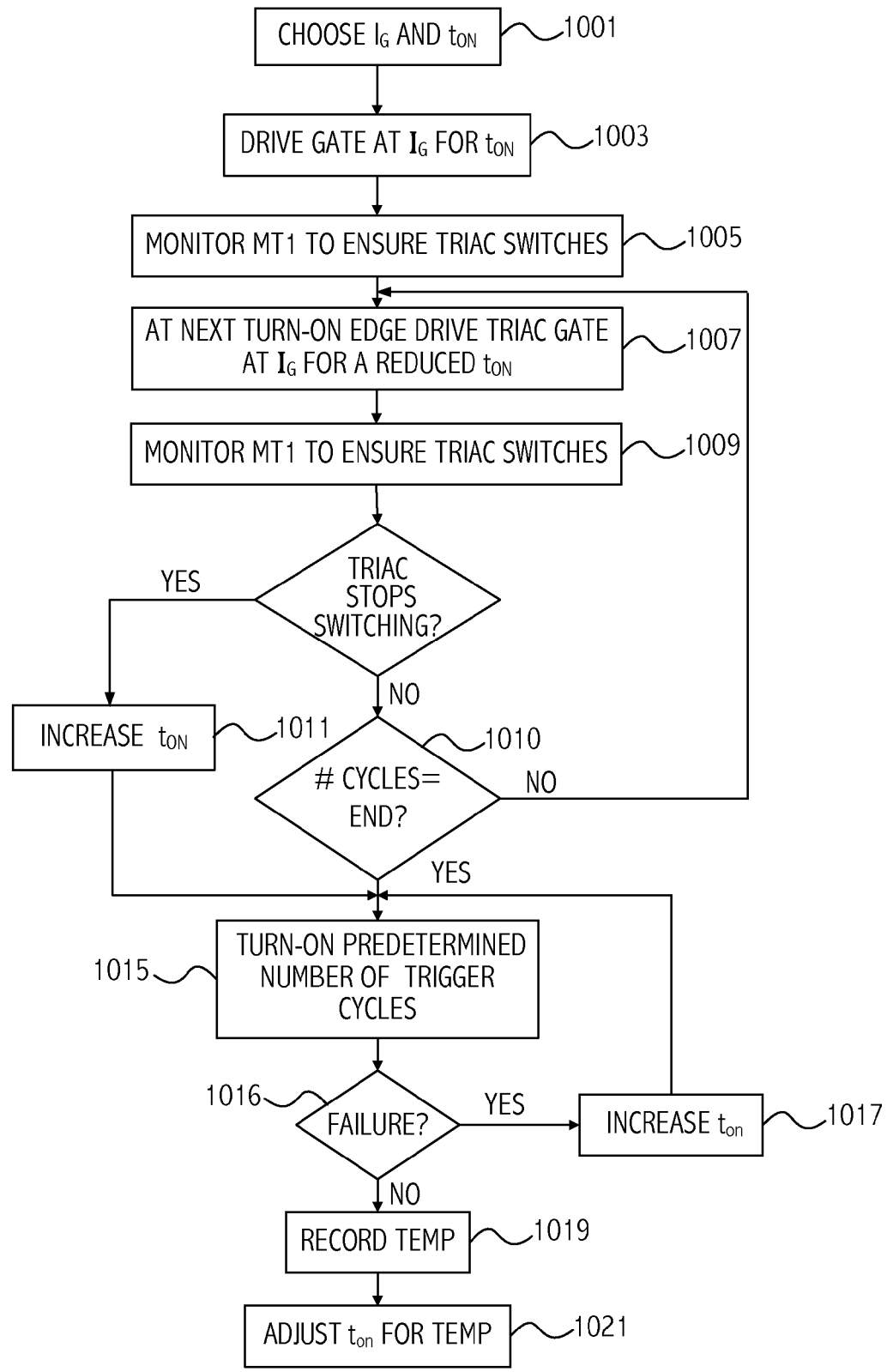
FIG. 10 illustrates a flow diagram for an adaptive triac gate drive controller to adaptively set pulse width according to an embodiment.

In order to guarantee triac gate drive requirements are met, one approach is to supply a drive signal of, e.g., 100 mA for 50-100 µs. Another approach that is more energy efficient is to make use of an adaptive gate drive controller. Referring to FIG. 10, an adaptive gate drive controller, e.g., controller circuit 504 in FIG. 5, selects an initial $I_G$ and $t_{on}$ in 1001, where $I_G$ is the gate current magnitude and $t_{on}$ is the pulse width. The adaptive gate drive controller may be implemented using a programmed microcontroller 141, other logic, or a combination to implement the functionality described, e.g., in FIGS. 10 and 11. Initial values for pulse width and current magnitude, along with other control values such as decrement values for pulse width and/or current magnitude, minimum values for pulse width and/or current magnitude, maximum number of cycles to utilize to determine an effective gate drive signal, and program code may be stored in non-volatile memory, e.g., NVM 142 in the integrated circuit 105 (see FIG. 1).

In 1001, in an exemplary embodiment the controller selects $I_G$ to be 100 mA and $t_{on}$ to be 100 µs. The gate is driven at 1003 with a drive signal having the current magnitude and pulse width selected. In an embodiment, the triac terminal MT1 is monitored in 1005 by the current sensor provided by the power controller 100 to ensure the triac switches. Typically, triacs are labeled as shown in FIGS. 5, and 12-14. The MT2 terminal is usually connected to the line and MT1 is usually connected to the load (but not always). The current driven to the gate (G) returns through MT1. Rather than sensing current, the voltage supplied to the load may be monitored, e.g., by the voltage sensor provided by the power controller 100. In an embodiment, the voltage from line to load (from MT2 to MT1) is sensed to determine if the triac has switched. For example, in non-isolated applications, the controller integrated circuit may be referenced to the load voltage (MT1). In such applications, the divider output of a resistive voltage divider from line to local ground may be monitored to determine if the triac has switched.

At the next turn-on edge the controller drives the triac gate for a reduced $t_{on}$ time in 1007. For example, the pulse width may be reduced by 10 µs or the pulse width may be divided by 2. In 1009, the controller checks if drive signal caused the triac to switch. If the triac fails to switch at that pulse width, the pulse width is increased in 1011. If the triac switched successfully, the adaptive controller checks if a predetermined number of cycles has been completed or a threshold lower limit threshold has been reached, e.g., a pulse width of 10 µs. If the lower limit or threshold has not been reached, the adaptive gate drive controller returns to 1007 to continue to reduce $t_{on}$ until a switch failure, a threshold number of cycles, or a minimum pulse width has been reached. Once a pulse has been determined acceptable through a YES at 1010 or through 1011, the triac is turned on for a predetermined number of cycles in 1015, e.g., 100 cycles, to ensure that the selected pulse width works. If the pulse width works for 100 out of 100 cycles, then the drive signal parameters are considered good and are used to drive the triac. If there is a failure, then the pulse width may be increased at 1017 and the drive signal is again tested for the predetermined number of cycles. Once the drive signal is determined to be good (YES in 1016), the temperature may be recorded in 1019 using a temperature sensor on integrated circuit 105. The pulse width $t_{on}$ is adjusted for temperature since the temperature coefficient can be significant.

Figure 11:
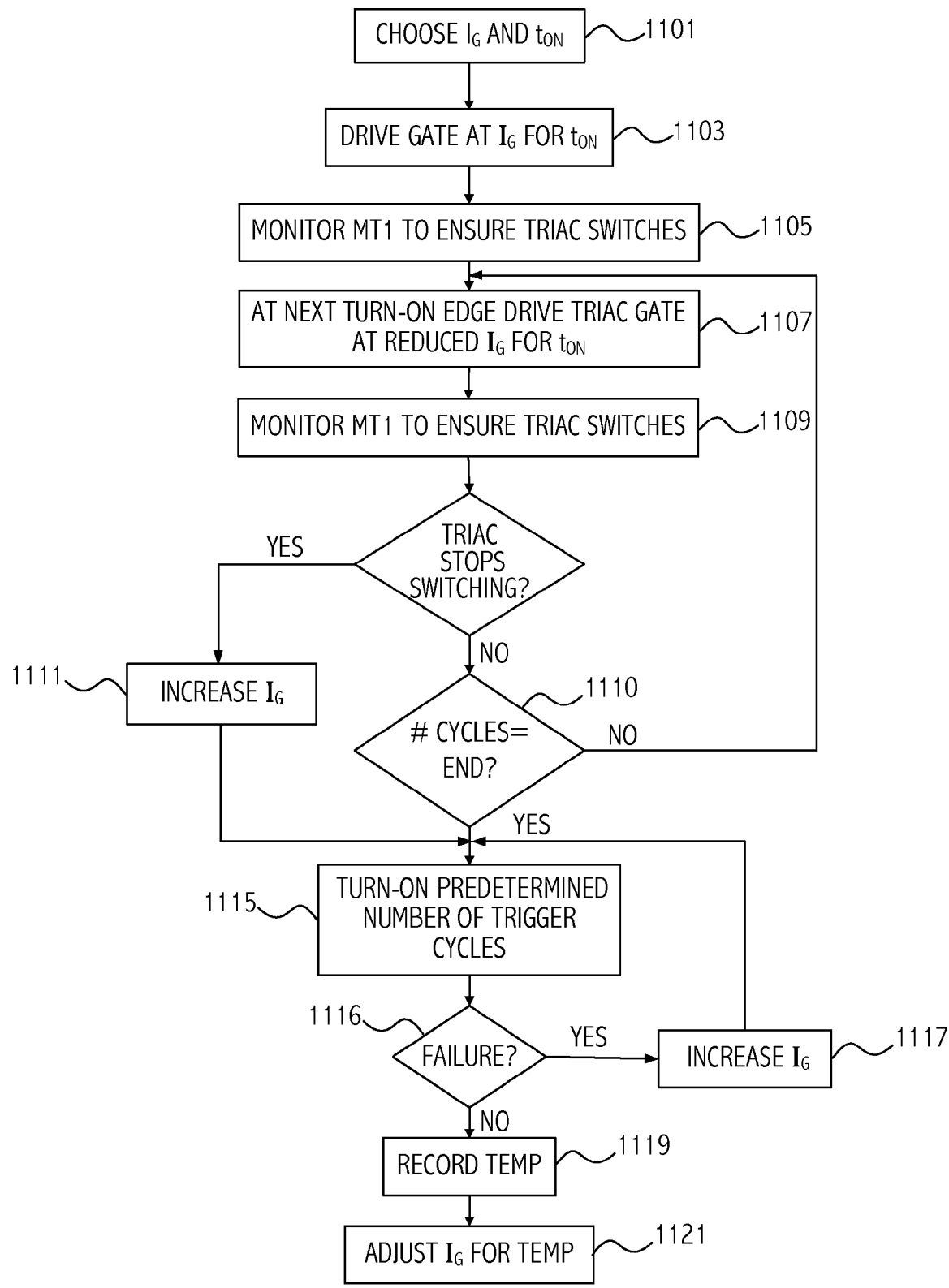
FIG. 11 illustrates a flow diagram for an adaptive triac gate drive controller to adaptively set current magnitude according to an embodiment.

While pulse width can be adaptively determined to reduce the pulse width of the triac drive signal, in addition or instead of reducing the pulse width, the current magnitude can also be reduced. Referring to FIG. 11, an adaptive gate drive controller, e.g., controller circuit 504 in FIG. 5 selects an initial $I_G$ and $t_{on}$ in 1101, where $I_G$ is the gate current magnitude and $t_{on}$ is the pulse width. Such values may be stored in non-volatile memory in the integrated circuit 105. The adaptive gate drive controller may be implemented using microcontroller 141, other logic, or a combination to implement the functionality described, e.g., in FIGS. 10 and 11.

In 1101, in an exemplary embodiment the controller selects $I_G$ to be 100 mA and $t_{on}$ to be 100 µs. The gate is driven at 1103 with a drive signal having the current magnitude and pulse width selected. In an embodiment, the triac terminal MT1 is monitored in 1105 by the current sensor provided by the power controller 100 to ensure the triac switches. Alternatively, the voltage supplied to the load may be monitored. At the next turn-on edge the controller drives the triac gate with a reduced $I_G$ in 1107. For example, the current magnitude may be reduced by 10 mA or by some other factor. In 1109, the controller checks if the drive signal caused the triac to switch. If the triac fails to switch at that current magnitude, the current magnitude is increased in 1111. If the triac switched successfully, the adaptive controller checks if a predetermined number of cycles has been completed or a threshold lower limit threshold has been reached, e.g., an $I_G$=10 mA. If the lower limit or threshold has not been reached, the adaptive gate drive controller returns to 1107 to continue to reduce $I_G$ until a switch failure, a threshold number of cycles, or a minimum current magnitude has been reached. Once a pulse has been determined acceptable through a YES at 1110 or through 1111, the triac is turned on for a predetermined number of cycles in 1115, e.g., 100 cycles, to ensure that the selected current magnitude works consistently. If the drive signal works for 100 out of 100 cycles, then the drive signal parameters are considered good and are used to drive the triac. If there is a failure, then the current may be increased at 1117 and the drive signal is again tested for the predetermined number of cycles. Once the drive signal is determined to be good (YES in 1116), the temperature may be recorded in 1019 using a temperature sensor on integrated circuit 105. The pulse width $I_G$ is adjusted for temperature in 1121 since the temperature coefficient can be significant.

While current and pulse width determinations are shown as being done separately, they can be done at the same time or sequentially. Thus, both pulse width and current magnitude can be lowered until thresholds are reached or switching failure occurs. If a failure occurs, one or both of current magnitude and pulse width can be adjusted upward until switching success is achieved. Sequential determinations can also be done. For example, an appropriate pulse width may be determined first as in FIG. 10 and that pulse width is used as the pulse width to determine an appropriate current magnitude. Alternatively, current magnitude may be determined first and then pulse width determined through the adaptive gate drive control. The adaptive gate drive control may be performed in response to a turn-on command or at another appropriate calibration time. Use of the adaptive gate drive mechanism allows less power to be consumed when controlling the triac.

Figure 12:
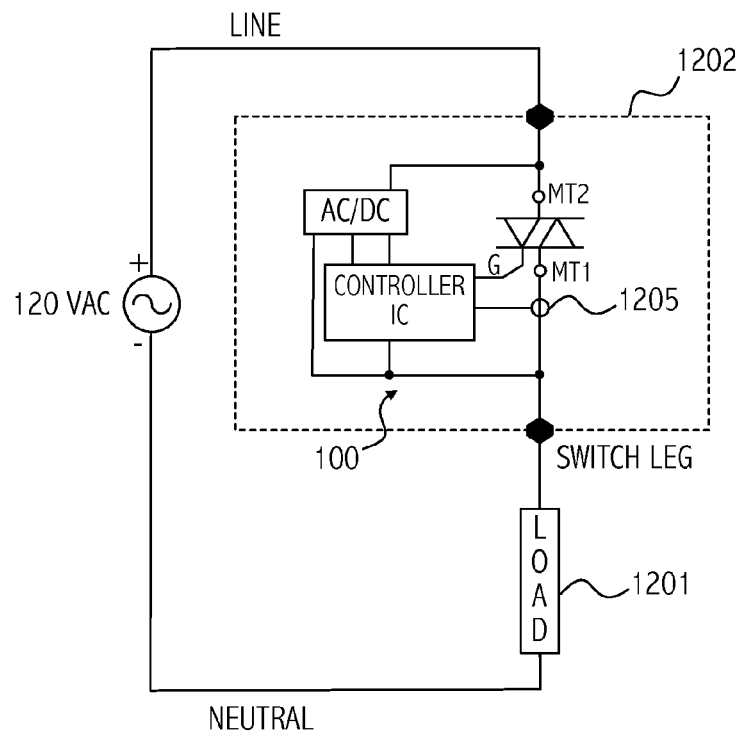
FIG. 12 illustrates a wiring configuration in which a power controller described herein may be utilized.

The power controller described herein may be used in multiple wiring configurations. Referring to FIG. 12, illustrated is a common light switch wiring configuration, where the load 1201 may be a light. The power controller 100 may be disposed in the switch box 1202. A minimum conduction angle may be used to ensure a minimum voltage drop across the AC/DC. The current sense at 1205 is provided on the high side of the load 1203. Note that the AC/DC converter works over a wide input range, e.g., from 30 VAC to full line voltage due to the fact that the triac may operate only part of the cycle. Note also that if the load goes open circuit, the power controller become unusable.

Figure 13:
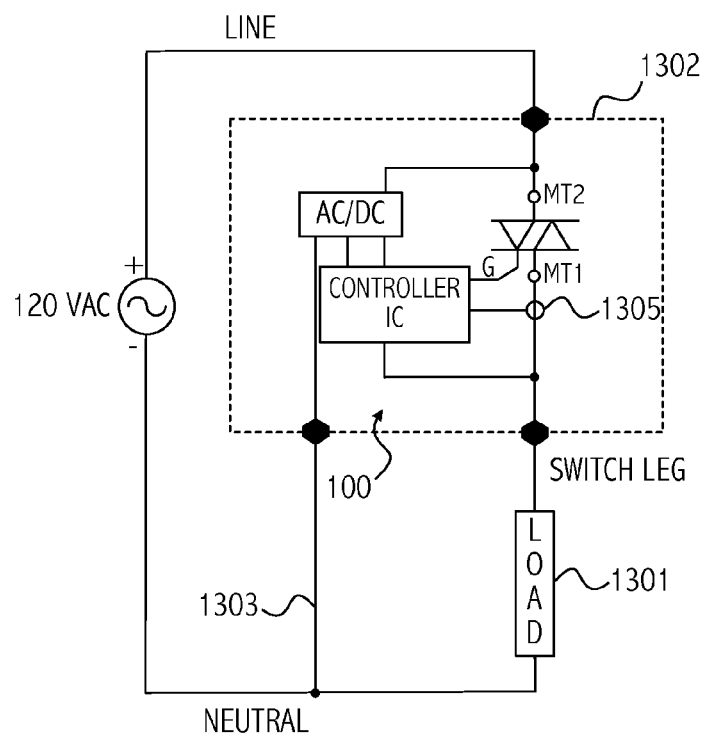
FIG. 13 illustrates another wiring configuration in which a power controller described herein may be utilized.

In another configuration, as shown in FIG. 13, the power controller 100 is connected to neutral through a connection 1303 and controls a remote load 1301. The power controller has access to full line voltage and the AC/DC converter can operate over a narrower input range. The current sense 1305 is high side. In this configuration, if the load goes open circuit, the power controller still works.

Figure 14:
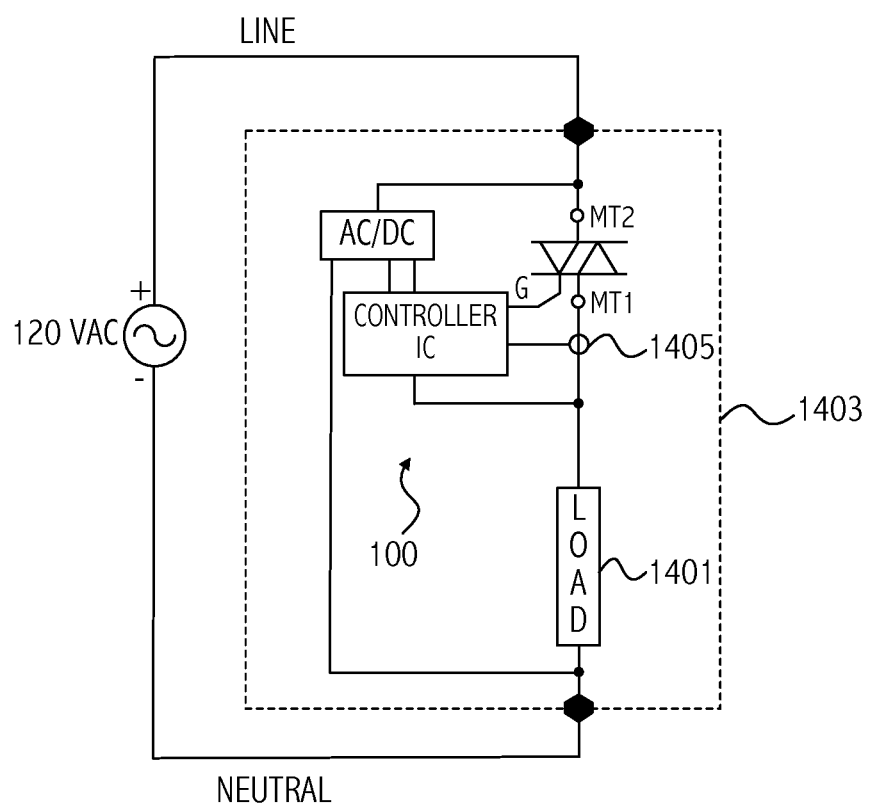
FIG. 14 illustrates another wiring configuration in which a power controller described herein may be utilized.

In another configuration shown in FIG. 14, the load 1401 is in the same housing 1403 as the power controller 100. The power controller has access to full line voltage and the AC/DC converter can operate over a narrower input range. The current sense 1405 is high side. In this configuration, if the load goes open circuit, the power controller still works.

The description of the invention set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. An apparatus comprising:
   an adaptive triac control circuit to supply a triac gate drive signal at a plurality of levels of at least one of pulse width and current magnitude to determine an effective drive signal having a lower level of at least one of pulse width and current magnitude than at least one of the plurality of levels; and
   wherein the adaptive triac control circuit is responsive to sensed voltage or sensed current to determine if a triac switches at the plurality of levels.

2. The apparatus as recited in claim 1 wherein the adaptive triac control circuit determines the effective drive signal in response to a power-up condition.

3. The apparatus as recited in claim 1, further comprising:
   a current sense circuit;
   wherein the adaptive triac control circuit is coupled to the current sense circuit to determine if the triac switches at the plurality of levels of the triac gate drive signal based on the sensed current.

4. The apparatus as recited in claim 1,
   wherein the adaptive triac control circuit is configured to stop supplying the gate drive signal at a lower level of at least one of pulse width and current magnitude in response to a predetermined number of the plurality of levels being applied.

5. The apparatus as recited in claim 1,
   wherein the triac control circuit is configured to supply a gate drive signal at a higher level of at least one of pulse width or current magnitude in response to the gate drive signal at a particular pulse width and a particular current magnitude failing to switch the triac.

6. The apparatus as recited in claim 1,
   wherein after the effective drive signal having a particular drive signal level is selected having a selected pulse width and a selected current magnitude, the adaptive triac control circuit is configured to test gating of the triac for a predetermined number of cycles at the particular drive signal level.

7. The apparatus as recited in claim 1,
   wherein after the effective drive signal having a particular drive signal level is selected having a selected pulse width and a selected current magnitude, at least one of pulse width or drive current of the effective drive signal is varied according to temperature.

8. The apparatus as recited in claim 1 further comprising the triac coupled to receive the gate drive signal from the adaptive triac control circuit.

9. A method comprising:
   supplying a triac gate drive signal at a plurality of levels of at least one of pulse width and current magnitude to determine an effective gate drive signal that causes a triac to switch, the effective gate drive signal having a lower level of at least one of pulse width and current magnitude than at least another triac gate drive signal supplied at one of the plurality of levels.

10. The method as recited in claim 9 further comprising supplying the gate drive signal during a calibration of the triac with both pulse width and current magnitude reduced from initial values during the calibration.

11. The method as recited in claim 9 further comprising supplying the gate drive signal with successively lower levels of at least one of pulse width and current magnitude.

12. The method as recited in claim 9, further comprising:
    sensing current or voltage; and
    monitoring switching of the triac at each of the levels to determine if the drive signal is effective based on the sensed current or voltage indicating that the triac switched.

13. The method as recited in claim 9, further comprising stopping reducing levels of the triac gate drive signal after a predetermined number of the successively lower levels are applied.

14. The method as recited in claim 9, further comprising stopping reducing the levels in response to the triac gate drive signal failing to switch the triac.

15. The method as recited in claim 9, further comprising:
    after a triac gate drive signal level is selected having a selected pulse width and a selected current magnitude from among the triac gate drive signals supplied at the plurality of levels, testing gating of the triac for a predetermined number of cycles at the selected drive signal level.

16. The method as recited in claim 9, further comprising:
after a triac gate drive signal level is selected having a selected pulse width and a selected current magnitude, varying at least one of the pulse width or current magnitude of the drive signal varied according to temperature.

17. A method of calibrating a triode alternating current switch (triac) comprising:
supplying a plurality of different levels of a gate drive signal to the triac, which selectively supplies power to a load according to the gate drive signal, the different levels being different with respect to at least one of pulse width and current magnitude of the gate drive signal; and
monitoring which of the different levels of the gate drive signal causes the triac to switch and thereby supply the power to the load.

18. The method as recited in claim 17 comprising:
stopping supplying the gate drive signal at additional lower levels of at least one of pulse width and current magnitude in response to reaching a lower threshold limit of at least one of pulse width and current magnitude.

19. The method as recited in claim 17 comprising:
stopping supplying successively lower levels of the gate drive signal to the triac in response having supplied a predetermined number of the different levels of the gate drive signal to the triac.

20. The method as recited in claim 17 further comprising:
stopping supplying additional lower levels of the gate drive signal to the triac in response to one of the different levels of the gate drive signal causing the triac to fail to switch.

\* \* \* \* \*

UNITED STATES PATENT AND TRADEMARK OFFICE
CERTIFICATE OF CORRECTION

PATENT NO. : 8,816,752 B2  
APPLICATION NO. : 13/731319  
DATED : August 26, 2014  
INVENTOR(S) : Eric B. Smith Page 1 of 1

It is certified that error appears in the above-identified patent and that said Letters Patent is hereby corrected as shown below:

In the Claims,

Column 12, line 53, in claim 13, line 1, please insert --:-- after "comprising";

Column 12, line 57, in claim 14, line 1, please insert --:-- after "comprising";

Column 13, line 24, in claim 19, line 3, please insert --to-- after "response".

Signed and Sealed this  
Tenth Day of February, 2015

Michelle K. Lee  
*Deputy Director of the United States Patent and Trademark Office*